(12) United States Patent
Lahiri

(10) Patent No.: US 10,944,417 B1
(45) Date of Patent: Mar. 9, 2021

(54) RADIO FREQUENCY DAC WITH IMPROVED LINEARITY USING SHADOW CAPACITOR SWITCHING

(71) Applicant: XILINX, INC., San Jose, CA (US)

(72) Inventor: Abhirup Lahiri, Dublin (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/922,899

(22) Filed: Jul. 7, 2020

(51) Int. Cl.
| | |
|---|---|
| *H03M 1/00* | (2006.01) |
| *H03M 1/74* | (2006.01) |
| *H03M 1/10* | (2006.01) |
| *H03M 1/80* | (2006.01) |

(52) U.S. Cl.
CPC .......... *H03M 1/742* (2013.01); *H03M 1/002* (2013.01); *H03M 1/1057* (2013.01); *H03M 1/80* (2013.01)

(58) Field of Classification Search
CPC ...... H03M 1/0863; H03M 1/747; H03M 1/74; H03M 1/68; H03M 1/742; H03M 1/66; H03M 3/50; H03M 1/745; H03M 3/47; H04B 1/0475; H04B 1/0007; H04B 1/04; H04B 1/18; H04B 1/44; H04B 1/48; H04B 2001/045; H04B 1/0003; H04B 1/0458; H04B 14/068; H04B 2203/542; H04B 3/542; H04B 3/56; H04L 12/43; H01L 2924/0002; H01L 2924/00; H01L 27/14612; H01L 27/14618; H01L 27/14634; H01L 27/14636; H01L 27/14643; H01L 27/1225
USPC .................................. 341/136, 144
See application file for complete search history.

(56) References Cited

U.S. PATENT DOCUMENTS

| | | | |
|---|---|---|---|
| 7,474,243 B1* | 1/2009 | Kuttner | H03M 1/0863 341/136 |
| 8,803,720 B2* | 8/2014 | Dufrene | H03M 1/66 341/144 |
| 8,890,730 B2 | 11/2014 | Lowney et al. | |
| 9,397,676 B1* | 7/2016 | Nguyen | H03M 1/002 |
| 9,432,036 B1 | 8/2016 | Lowney et al. | |
| 9,614,541 B2* | 4/2017 | Chakrabarti | H03M 1/78 |
| 10,644,716 B1* | 5/2020 | Luo | H03M 1/662 |
| 2011/0085616 A1* | 4/2011 | Kuttner | H03M 1/685 375/295 |
| 2011/0129037 A1* | 6/2011 | Staszewski | H03F 3/193 375/316 |

(Continued)

OTHER PUBLICATIONS

Lin, Chi-Hung, et al., "A 12 bit 2.9 GS/s DAC With IM3 < -60 dBc Beyond 1 GHz in 65 nm CMOS", IEEE Journal of Solid-State Circuits, vol. 44, No. 12, Dec. 12, 2019 (10 pages).

(Continued)

*Primary Examiner* — Linh V Nguyen
(74) *Attorney, Agent, or Firm* — Patterson + Sheridan, LLP

(57) ABSTRACT

A DAC current steering circuit includes a first transistor whose: drain is coupled to a first output, source is coupled to a drain of a second transistor at a first node, and gate is coupled to a data input, and a third transistor whose: drain is coupled to a second output, source is coupled to a drain of a fourth transistor at a second node, and gate is coupled to a complement of the data input. The circuit further includes first and second shadow capacitors respectively coupled, via first and second switches, between the first and second nodes and ground, the first and second switches respectively controlled by the complement of the data input, and the data input.

20 Claims, 10 Drawing Sheets

(56) References Cited

U.S. PATENT DOCUMENTS

| | | | | |
|---|---|---|---|---|
| 2015/0171878 A1* | 6/2015 | Schafferer | ............... | H03M 1/74 |
| | | | | 375/297 |
| 2017/0005654 A1* | 1/2017 | Zhang | .................. | H03K 17/687 |
| 2017/0201263 A1* | 7/2017 | Lee | ..................... | H03M 1/0604 |
| 2017/0222859 A1* | 8/2017 | Lehtinen | .................. | H04B 1/04 |
| 2018/0097486 A1* | 4/2018 | Salem | ................... | H03F 3/2171 |
| 2020/0091955 A1* | 3/2020 | Wang | ..................... | H01Q 1/246 |

OTHER PUBLICATIONS

"Zynq UltraScale+ RFSoC RF Data Converter v2.2", LogiCORE IP Product Guide, Vivado Design Suite, PG269 (v2.2) Oct. 30, 2019 (261 pages).

\* cited by examiner

700

710 — Provide a first transistor and a second transistor, a drain of the first transistor coupled to a first output, a source of the first transistor coupled to a drain of the second transistor at a first node, and a gate of the second transistor coupled to a data input

720 — Provide a third transistor and a fourth transistor, a drain of the third transistor coupled to a second output, a source of the third transistor coupled to a drain of the fourth transistor at a second node, and a gate of the fourth transistor coupled to a complement of the data input

730 — Connect a source of the second transistor and a source of the fourth transistor, and couple them to ground

740 — Provide a first bleed current source coupled between the first node and ground, and a second bleed current source coupled between the second node and ground

750 — Provide first and second shadow capacitors, respectively coupled, via first and second switches, between the first and second nodes and ground, the first switch controlled by the complement of the data input, and the second switch controlled by the data input.

RADIO FREQUENCY DAC WITH IMPROVED LINEARITY USING SHADOW CAPACITOR SWITCHING

TECHNICAL FIELD

Embodiments of the present invention generally relate to digital to analog converters (DACs), and in particular to a radio frequency (RF) DAC that implements shadow capacitor switching.

BACKGROUND

Digital-to-analog conversion is the process of converting digital (binary) codes into a continuous range of analog signal levels. Digital codes can be converted into analog voltage, analog current, or analog charge signals using a digital-to-analog converter (DAC).

Code dependent output impedance loading is a major source of non-linearity in DACs. At high speeds, the switched output impedance is generally capacitive. Thus, maximizing the output impedance helps to reduce distortion from the DAC. Prior approaches to address this problem added additional bleeder currents to the DAC circuitry, to improve linearity and reduce distortion. A DAC cell includes a differential amplifier, with two outputs, known as OutP and OutN. In a multi-bit DAC, e.g., an N-bit DAC, there are $2^N$ individual DAC cells whose OutP and OutN outputs are all respectively connected. Thus, if the digital data inputs to the DAC shift current, over the plurality of DAC cells comprising the DAC, predominantly to the OutP or OutN outputs, the output impedance at each of the two outputs of the DAC is different, and fluctuates. This is due to resistances and capacitances of the transistors used to implement the DAC cells. This phenomenon is known as code dependent loading, and causes non-linearity or distortion.

Therefore, a need exists for an improved DAC that reduces code dependent output impedance loading.

SUMMARY

Various DAC current steering cells are described herein. A method of operating a DAC current cell is also described herein. In one example, a DAC current steering circuit is provided. The circuit includes first and second transistors, a drain of the first transistor coupled to a first output, a source of the first transistor coupled to a drain of the second transistor at a first node, and a gate of the second transistor coupled to a data input. The circuit further includes third and fourth transistors, a drain of the third transistor coupled to a second output, a source of the third transistor coupled to a drain of the fourth transistor at a second node, and a gate of the fourth transistor coupled to a complement of the data input. The circuit still further includes first and second shadow capacitors that are respectively coupled, via first and second switches, between the first and second nodes and ground. The first switch is controlled by the complement of the data input, and the second switch is controlled by the data input.

In another example, a DAC current steering circuit is provided. The circuit includes a first transistor, a drain of the first transistor coupled to a first output node, a source of the first transistor coupled to a common node, and a gate of the first transistor coupled to a data input, and a second transistor, a drain of the second transistor coupled to a second output node, a source of the second transistor coupled to the common node, and a gate of the second transistor coupled to a complement of the data input. The circuit further includes first and second shadow capacitors respectively coupled, via first and second switches, between the first and second output nodes and ground, the first switch controlled by the complement of the data input, and the second switch controlled by the data input.

In yet another example, a method of operating a DAC is provided. The method includes receiving a digital data signal ("data") at a gate of a first transistor of a source coupled pair, the sources each coupled to ground, and the drains respectively coupled to a first output and a second output, and receiving a complement of the data signal ("data bar") at a gate of a second transistor of the source coupled pair. The method further includes connecting a first shadow capacitor between a drain of the first transistor and ground in response to the value of data bar, such that when data is low the first shadow capacitor is connected, and connecting a second shadow capacitor between a drain of the second transistor and ground in response to the value of data, such that when data is high the second shadow capacitor is connected.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 7 is a flow diagram of a method for providing a DAC current cell, according to an example.

To facilitate understanding, identical reference numerals have been used, where possible, to designate identical elements that are common to the figures. It is contemplated that elements of one embodiment may be beneficially incorporated in other embodiments.

DETAILED DESCRIPTION

Various circuits are described below that improve the linearity of RF DACs. As a result, they also improve the DACs' adjacent channel leakage ratio (ACLR), which is a critical specification for RF transmitters. According to one or more examples, by means of shadow capacitor switching, a switching output impedance of a given RF DAC is maximized, leading to reduced code dependent output impedance loading and thereby reducing distortion for the DAC.

In one or more examples, DAC current steering cells operate to maximize switching output impedance by employing shadow capacitors. The shadow capacitors switch in a way such that from the point of view of the output of the DAC, the impedance looking inwards appears to be non-switching, and therefore "silent." Because effective output impedance is not more switching and is constant, it does not contribute to code dependent loading and thus does not contribute to non-linearity.

Figure 1:
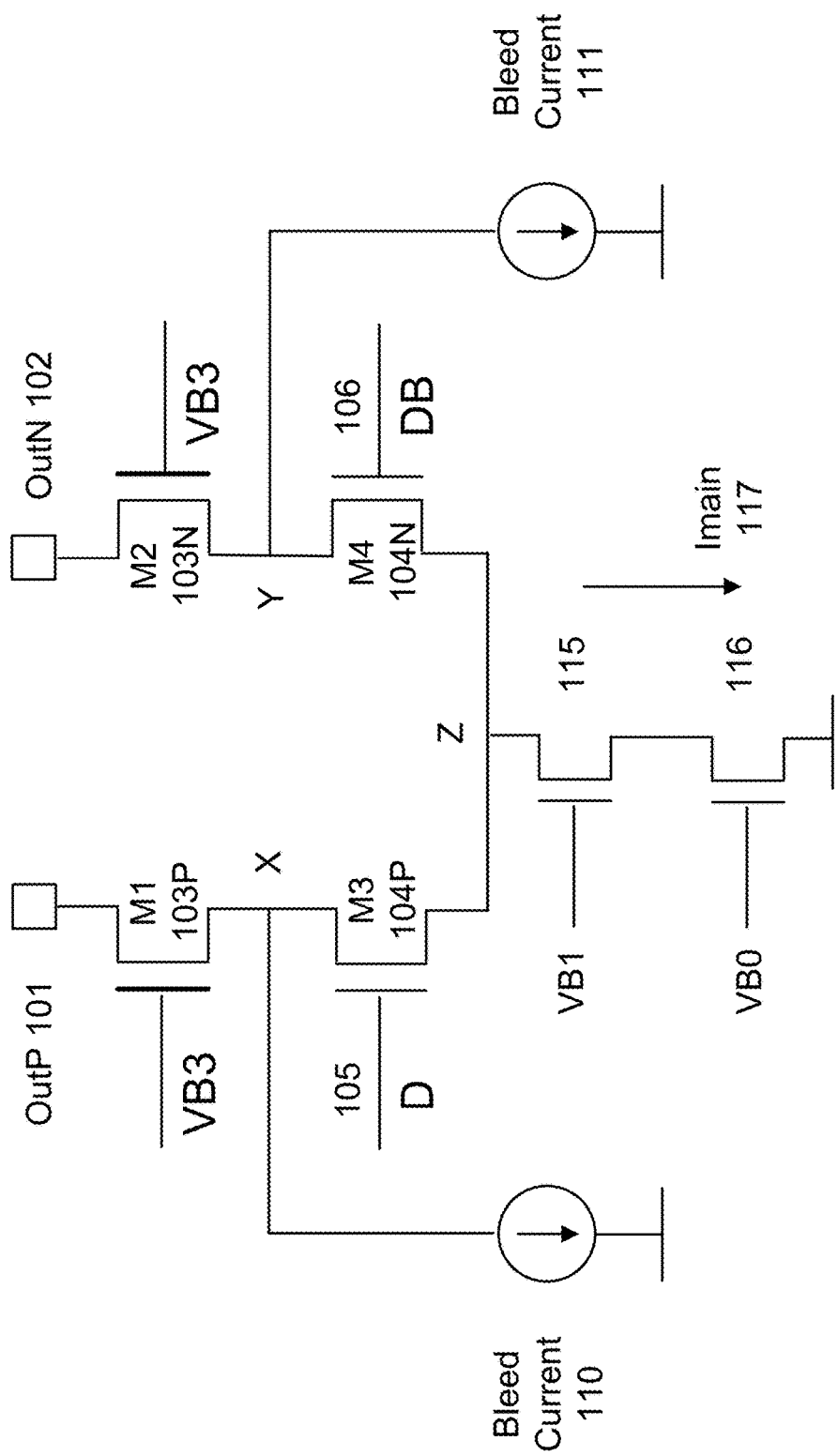
FIG. 1 is a conventional current steering DAC current cell provided with bleed currents to improve linearity.

Turning now to FIG. 1, a conventional current steering DAC cell with added bleed current sources is illustrated. As noted above, the addition of bleed currents is a conventional approach seeks to improve the linearity of the DAC.

With reference to FIG. 1, it is noted that its features are common to each of the examples illustrated in FIGS. 2-4 and 6A, and it is thus convenient to describe them once, at the outset of this disclosure, with reference to FIG. 1. Then, the description of the subsequent figures may focus on the additions and modifications to the basic DAC cell, as are respectively illustrated in each of the examples of FIGS. 2-4 and 6A. In some examples, the conventional current steering DAC cell of FIG. 1 may be one cell out of, for example, 1024 equally sized cells provided in parallel, for a 1024 bit DAC. The DAC cells are collectively used to convert a set of digital inputs into an output analog signal waveform.

Continuing with reference to FIG. 1, there is shown a differential amplifier 100 that includes two stacks of cascoded transistors. One stack is on the left, including transistors M1 103P and M3 104P, and connected to a first output, OutP 101, and another stack is shown on the right of the figure, including transistors M2 103N and M4 104N, and is connected to a second output, OutN 102. M1 103P and M2 103N are generally identical transistors, as are M3 104P and M4 104N, due to the symmetry of the DAC cell. As shown, the upper transistors, transistors M1 103P and M2 103N, have an identical voltage VB3 supplied to each of their gates, which keeps both M1 103P and M3 104P on. In some examples, VB3 may be equal to or close to an upper voltage Vdd that is supplied to the differential amplifier. There is also a lower tier of transistors, namely M3 104P and M4 104N, whose gates are supplied with data signal D 105 and its complement DB 106, respectively. The lower set of transistors, M3 104P and M4 104N, are source connected at node Z. Current steering DAC cell 100 steers the current to one of the two outputs OutN 102 or OutP 101 by the gate voltage that is applied to the lower transistors M3 104P and M4 104N. Thus, when D is high, or a logical "1", then M3 104P is on, and M4 104N is off, and the current is steered through OutP 101. Conversely, when D is low, and thus a logical "0", then its complement DB is a logical "1" and transistor M3 104P is off, and transistor M4 104N is on. As a result, the current is steered through OutN 101. In one or more examples, the signals D and DB are supplied to the DAC cell by digital circuitry to which a plurality of DAC current steering cells 100 are coupled. In general, DAC cell 100 has its own driver circuit, which may be, for example a CMOS driver, essentially a CMOS inverter. This allows each DAC cell in a plurality of DAC cells to be independently controlled, so that any shape of waveform, with essentially any set of frequency components, may be output by the DAC.

Continuing with reference to FIG. 1, at the bottom of the differential amplifier there is a current source element, made of cascoded transistors 115 and 116, whose gates are supplied with VB1 and VB0, respectively, such as, for example, by current mirrors. These voltages VB1 and VB0, a function of the currents being mirrored, determine the overall current $I_{main}$ 117 through the differential amplifier of DAC cell 100. It is noted that there could be, in alternate examples, a single transistor instead of the two transistors shown. Thus, in the example of FIG. 1, transistor 115's function is to improve the accuracy.

Although not shown in FIG. 1, at each output there is a resistive load connected between a supply voltage Vdd and the respective output. The resistances connected to OutP 101 and to OutN 102 are generally fixed resistors. An analog voltage is thus developed across each respective resistive load by steering the current left or right, in FIG. 1. For example, when the current is steered to OutP 101, then the voltage at OutP 101, which is VoutP=Vdd−Imain*R, where R is the fixed resistance connected at OutP, and the voltage at OutN 102 remains at Vdd, as there is no current flowing through the fixed resistance to which OutN is coupled. The differential voltage between OutP and OutN, {OutP−OutN} is thus (Vdd−Imain*R)−Vdd=−Imain*R. So, depending upon how the current is steered, OutP and OutN are either high or low. Thus, when the current is steered to OutN 102, then the voltage at OutN 102, which is VoutN=Vdd−Imain*R, where R is the fixed resistance connected at OutN, and the voltage at OutP 101 remains at Vdd, as there is no current flowing through the fixed resistance to which OutP is coupled. The differential voltage between OutP and OutN, {OutP−OutN} is thus Vdd−(Vdd−Imain*R)=+Imain*R. So the differential voltage of the DAC cell fluctuates between −Imain*R and +Imain*R. Each DAC cell connected on the left contributes a 1 Imain*R drop to the voltage on OutP 101, and similarly, each DAC cell connected on the right contributes a 1 Imain*R drop on OutN 102.

Because the voltage on each of OutP and OutN shifts from Vdd to Vdd-Imain*R every time D switches from "0" to "1", or DB switches from "0" to "1", as the case may be, there is a hard switch due to the switching on and off of M3 104P and M4 104N. Adding bleed currents 110 and 11 ameliorates this hard switching to some extent. This operates as follows. Because there is still some current running through M1 103P, as it is on, due to the fixed gate voltage VB3 supplied to it, even when M3 104P is off, and similarly, when M4 104N is off, due to DB being low, there is still some current running through M2 103N, as it is on, due to the fixed gate voltage VB3 supplied to it, by adding the bleed currents 110 and 111, respectively, the cascode transistors M1 103P or M2 103N each appear "quasi-on" from the point of view of the output impedance, even when their controlling transistor M3 104P or M4 104N, respectively, are actually off. This is because the bleeder current pulls some current through M1 103P or M2 103N, even when M3 104P or M4 104N, as the case may be, is off. Bleed currents 110 and 111 may be generated, for example, using current mirrors or other current source elements. In some examples the bleed currents are ½ that of $I_{main}$ 117. In general bleed currents are static, and provide a constant DC current.

Thus, the bleeder currents provide a "soft-on" state for M1 103P or M2 103N, respectively, when M3 104P or M4 104N are off, making these upper tier transistors appear to not be fully off. Although this ameliorates the situation somewhat, nonetheless, the switching of M3 104P and M4 104N still causes code dependent loading on the DAC cell, as next described. As shown in FIG. 1, when M3 104P is off, due to D being low, it has a different device capacitance than when M3 104P is on, and the same applies to M4 104N. Namely, its device capacitance is higher when it is on than when it is off. This loads different capacitances onto the respective outputs as a function of the switching on and off of M3 104P and M4 104N. If "1" or "0" bits predominate in the N-bits of an N-bit DAC applied to the N DAC cells, respectively, during a cycle, OutP 101 and OutN 102 will see dramatically different capacitances coupled with these nodes as a function of the codes applied at M3 104P and M4 104N of each of the respective DAC current cells. This effect is more pronounced at higher output frequencies, and causes code dependent loading and the distortions that are due to it.

Accordingly, in one or more examples this effect is minimized using a set of shadow capacitors that are switched with complimentary data phases, so that the output impedance is maximized for an output that is not "on" in a given DAC cell during a given cycle. The presence of the set of shadow capacitors makes the output impedance seem "silent", as the shadow capacitors simulate the capacitance that a given arm of the differential amplifier would have were its switching transistor actually on. Various implementations of DAC cells with added shadow capacitance are described below with reference to FIGS. 2-4 and 6.

Figure 2:
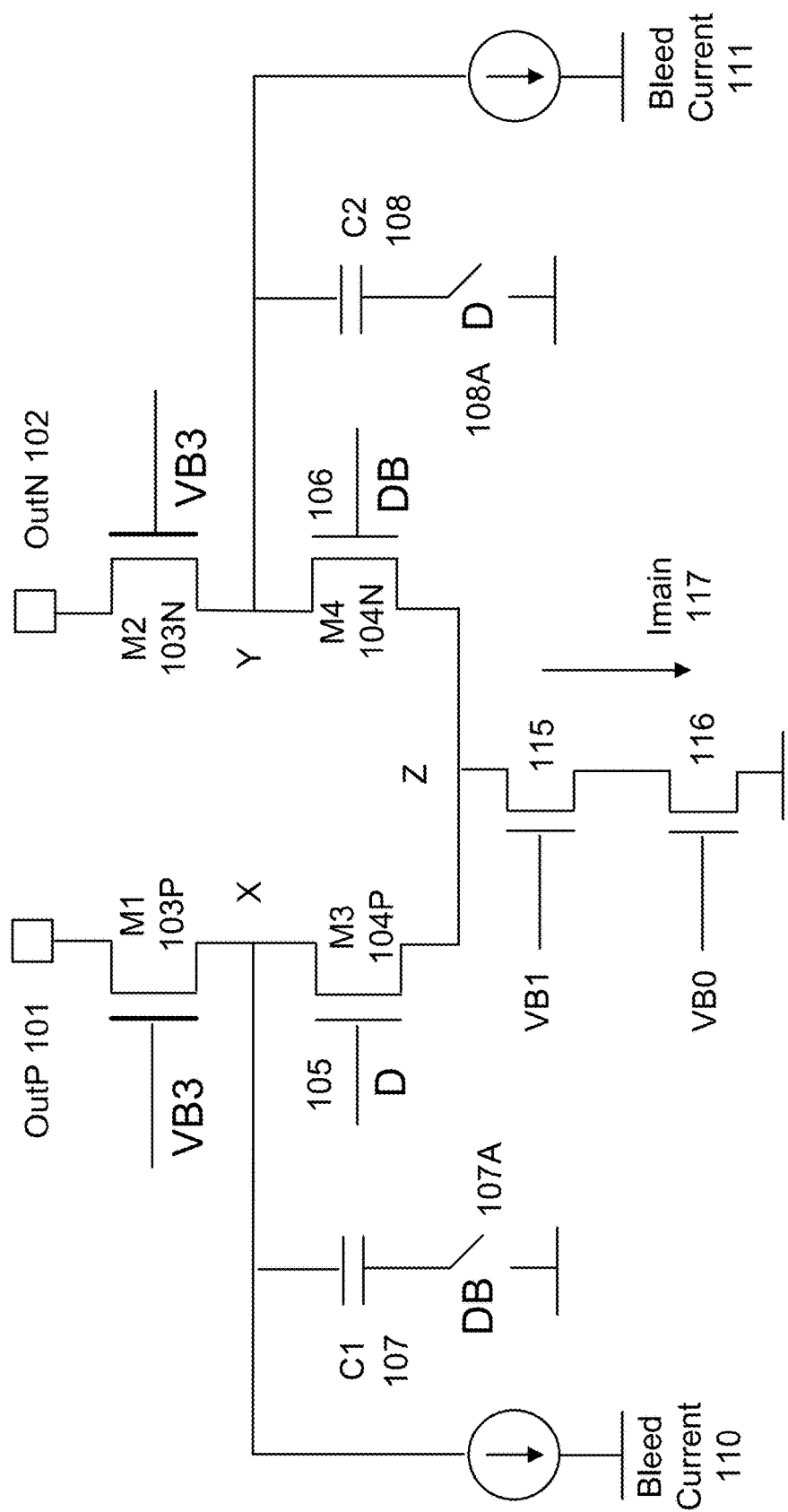
FIG. 2 is an example current steering DAC current cell with added shadow capacitors, according to an example.

FIG. 2 is an example current steering DAC current cell with added shadow capacitors, according to an example. It is here noted that in the example of FIG. 2, as well as in the examples of FIGS. 3, 4 and 6, bleed current sources 110 and 111 are also shown. However, in one or more examples, while they are useful, as described above, it is not necessary to use the bleed current sources and one may use just the shadow capacitors C1 and C2. FIG. 2 is similar to the example DAC current cell shown in FIG. 1, except for the addition of shadow capacitors. Thus, with reference to FIG. 2, only the added shadow capacitors C1 107 and C2 108, and their associated switches 108A and 108A, respectively, need be described. As shown, the two shadow capacitors are coupled between nodes X and Y by associated switches 107A and 108A, respectively. Switch 107A is closed when the DB signal is high, or a logical "1", and open otherwise, and switch 108A is closed when the DB signal is high, or a logical "1", and open otherwise. Thus, the shadow capacitances 107 and 108 are only respectively coupled to nodes X and Y of the differential amplifier when the switching transistor coupled to the respective node is off. In this manner, when transistor M3 104P is off, shadow capacitance 107 is added to the circuit, but not added when M3 104P is on, and when transistor M4 104N is off, shadow capacitance 108 is added to the circuit, but is not added when M4 104N is on. This serves to balance the capacitance in each side of the differential amplifier, so that at all times both sides of the differential amplifier have either the device capacitance of a switching transistor that is "on", or the added capacitance supplied by the shadow capacitors 107 and 108. In one or more examples, for symmetry, the shadow capacitors 107 and 108 are equal. As noted, this balancing of capacitances on both sides of the differential amplifier increases overall output capacitance of the circuit, and thus obviates, at least in part, code dependent loading.

Figure 3:
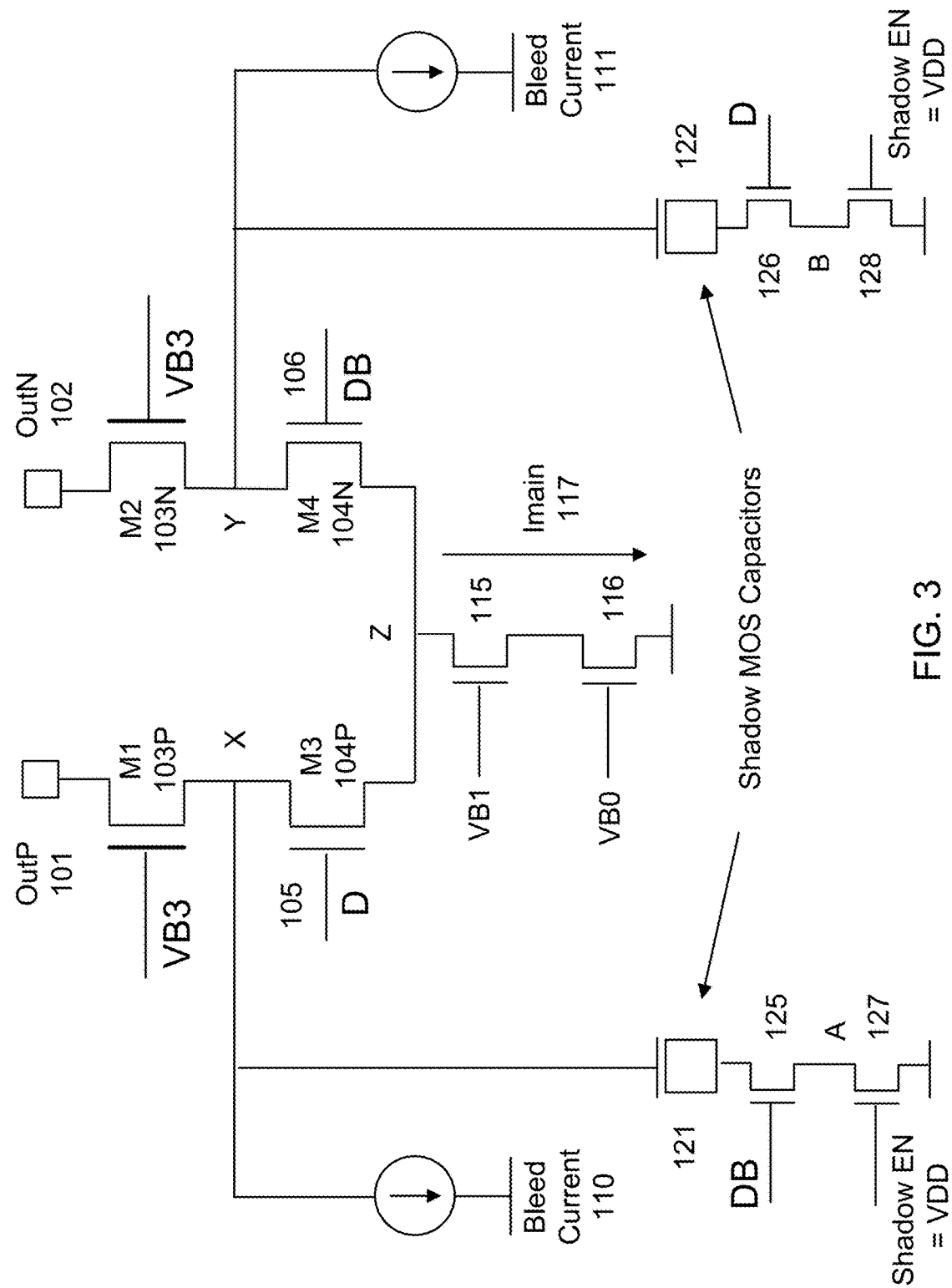
FIG. 3 is an example implementation of the DAC current cell of FIG. 2, using MOS capacitors for the shadow capacitors, according to an example.

FIG. 3 is an example implementation 300 of the DAC current cell 200 of FIG. 2, using MOS capacitors as the shadow capacitors, and also utilizing additional footer switches, according to an example. With reference thereto, MOS shadow capacitor 121 is shown on the left side of the circuit, and MOS shadow capacitor 122 is shown on the right side of the circuit. Additionally, each capacitor is coupled to the drain of a switching transistor, being transistors 125 and 126, respectively. Switching transistor 125 couples and decouples MOS shadow capacitor 121 in response to the complement of the data signal, DB, which is fed to its gate, and switching transistor 126 couples and decouples MOS shadow capacitor 122 in response to the data signal, DB, that is fed to its gate. Additionally, each switching transistor is coupled to a footer switch, which also must be on in order for the shadow capacitor to be coupled between its respective node and ground. Thus, with reference to the left side of the circuit, shadow capacitor 121 is coupled between node X and ground when both DB is high, thus turning on transistor 125, and the enabling signal "shadow EN" is also high, thus turning on footer switch transistor 127. Similarly, with reference to the right side of the circuit, shadow capacitor 122 is coupled between node Y and ground when both D is high, thus turning on transistor 126, and the enabling signal "shadow EN" is also high, thus turning on footer switch transistor 128.

In one or more examples, when asserted, the enabling signal shadow EN, as shown in FIG. 3, may be coupled to Vdd. The shadow EN signal may be used to take the shadow capacitors out of the DAC current cell when they are not needed. An example of this is illustrated in FIG. 5D, described below.

In alternate examples, the two shadow capacitors may be of any type, including metal, metal on insulator (MiN), metal on metal (MoM), or other capacitor types that may be available.

Figure 4:
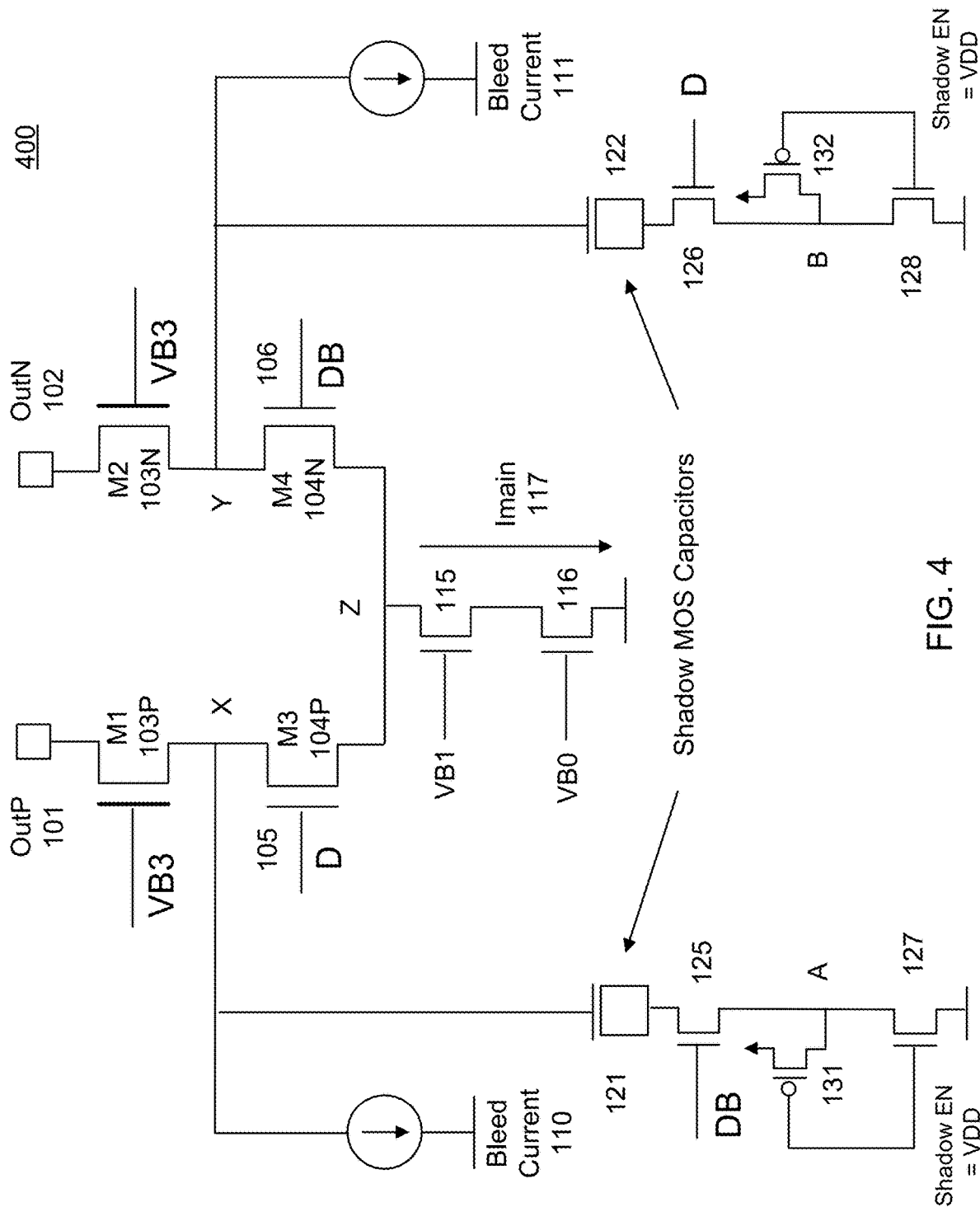
FIG. 4 is an alternate implementation of the DAC current cell of FIG. 3, according to an example.

FIG. 4 is an alternate implementation 400 of the DAC current cell 300 of FIG. 3, according to an example. The example of FIG. 4 adds two PMOS transistors 131 and 132, one to each footer switch. Transistors 131 and 132 may be referred to as "pull-up" transistors. In one or more examples, due to the general symmetry of the DAC current cell, they may be identical, and in one or more examples, they may be quite small, thus not needing to have the same area as the other transistors used in the cell. In one or more examples the pull-up transistors are used to pull up each of nodes A and B, respectively, following the enabling signal "Shadow EN" being de-asserted, and thus dropping to logical "0." When that happens, for example, in the case of the current cell of FIG. 3, each of nodes A and B is of indeterminate voltage, and thus floating.

Having nodes A and B floating in this way can introduce an amount of distortion or non-linearity when D and DB continue to fluctuate, based on the codes that are input into the DAC, by changing the capacitance in a subtle, but non-negligible manner. When the bottom switching transistors are turned off, D and DB signals are still being supplied, as even when the shadow capacitors are removed, the DAC is still on and operating. Thus, for example, on the left side of the circuit, when DB is high, for example, depending upon the actual voltage of node A, transistor 125 is on, and there will be some capacitance added to the circuit, namely, the capacitance of shadow capacitor 121 added to the device capacitance of footer switch 127. This added capacitance, however, is only added when DB is high, and thus there is a fluctuation, or second order modulation. The same fluctuation occurs at transistor 126, due to node B floating, so when D is high, transistor 126 is on, and there is an added capacitance from both capacitor 126, and the device capacitance of footer switch 128, in its off state. To remove any such distortion, once the Shadow EN signal is turned off, and thus, for example, changed to "0", transistors 131 and 132, whose gates are also supplied with "Shadow EN", are turned on, and act as pull-up devices, pulling up nodes A and B to Vdd, and thus not allowing these nodes to float, and fully shutting off transistors 125 and 126, which totally removes the shadow capacitances from the cell. Transistors 131 and 132 thus provide a "complete shut-off" of the shadow capacitance branches, so to speak.

FIGS. 5A through 5D, next described, are plots of simulation results for different example DAC current cells, with and without shadow capacitors, according to one or more examples. These are next described.

Figure 5A:
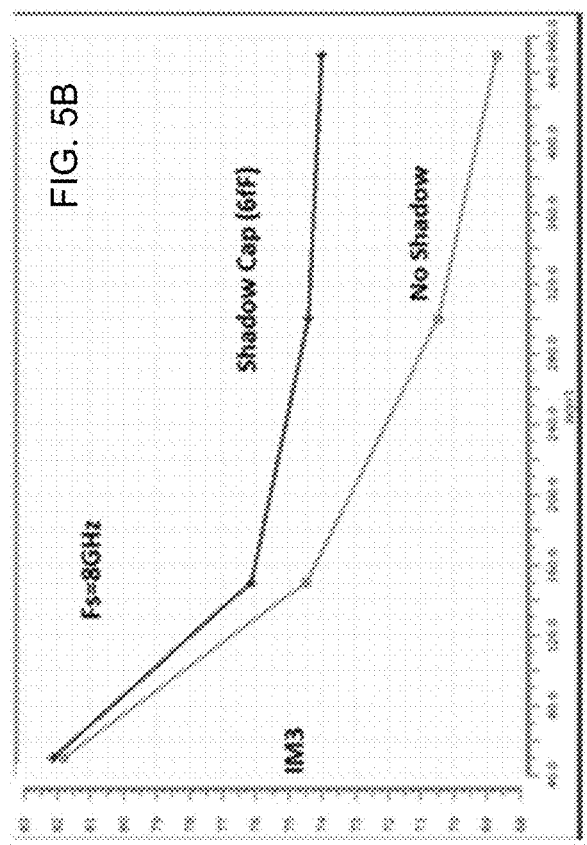
FIG. 5A depicts a plot of IM3 versus frequency for a sampling frequency (Fs) of 12 gigahertz (GHz), with and without shadow capacitances according to an example.

FIG. 5A depicts a plot of IM3 versus output frequency (i.e., the frequency that on is synthesizing with the DAC) for an Fs of 12 GHz, with and without shadow capacitances, according to an example. With reference to FIG. 5A, the X-axis is an output frequency (Ncyc*Fs/1024), which is the number of cycles multiplied by the sampling frequency divided by 1024, and the Y-axis is the intermodulation distortion or "IM3", a measure of third order distortion. As shown, the upper plot 590 illustrates the IM3 with a shadow capacitance of eight femptoFarads (8 fF) added, the plot 591 just below it with 6 fF added, and the plot 592, at the bottom of the figure, with no shadow capacitance. As shown, the effect is significant, and the benefits increase with frequency. It is also noted that the shadow capacitance is "shadowing" or trying to emulate a load on an output node. Thus, the proper capacitance to use in any specific context is a function of the load on the DAC outputs, in any given embodiment or example.

Figure 5B:
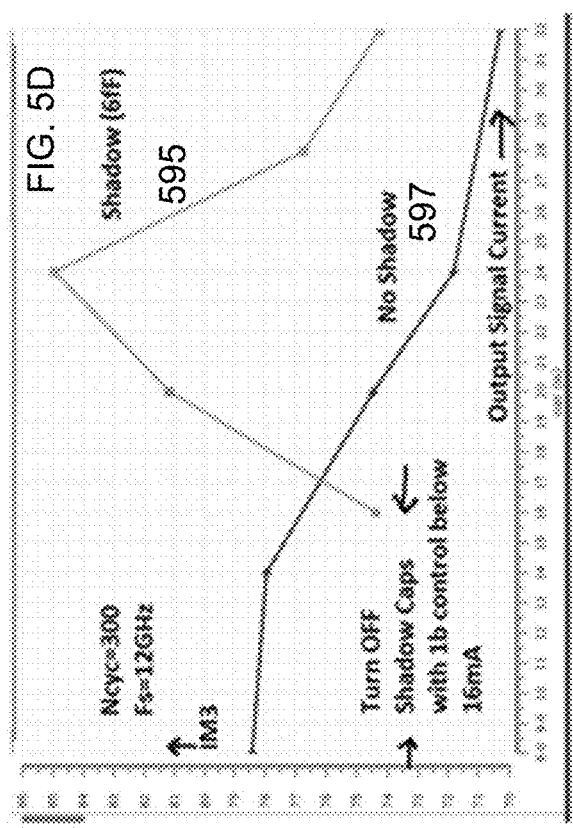
FIG. 5B depicts a plot of IM3 versus frequency for an Fs of 8 GHz, with and without shadow capacitances according to an example.
Figure 5C:
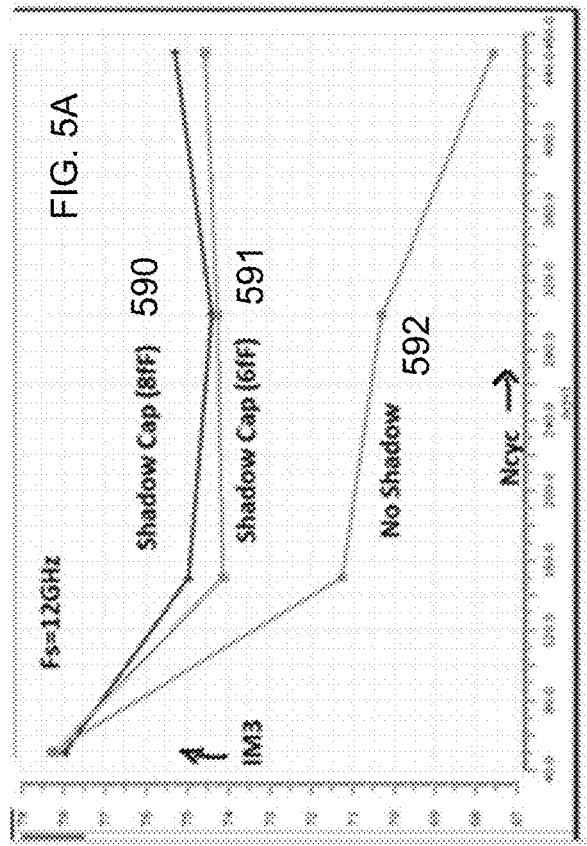
FIG. 5C depicts a plot of IM3 versus frequency for an Fs of 6 GHz, with and without shadow capacitances according to an example.
Figure 5D:
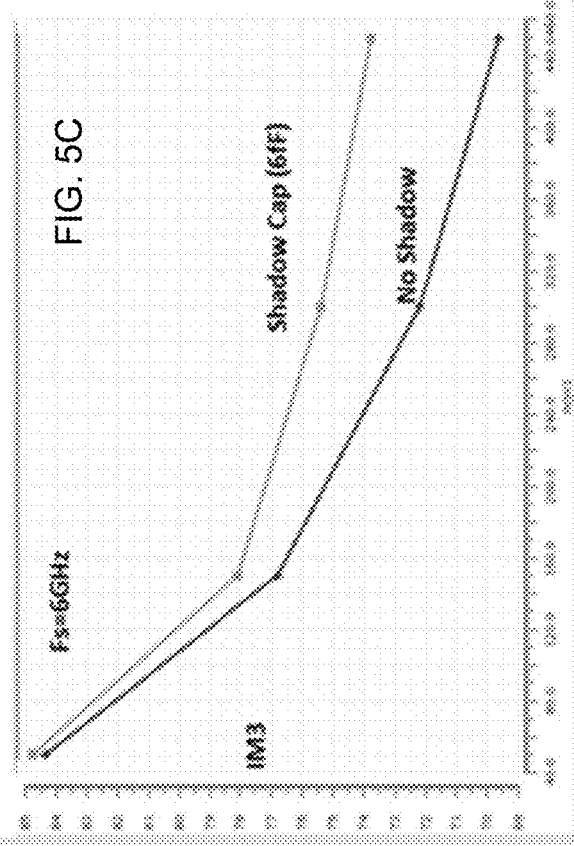
FIG. 5D depicts a plot of IM3 versus output signal current at a fixed frequency, with and without shadow capacitances according to an example.

FIG. 5B depicts a plot of IM3 versus output frequency for an Fs of 8 GHz, with and without shadow capacitances, according to an example. As shown, a shadow capacitance of 6 fF was used, and the effects are similar to those seen in the example of FIG. 5A. The upper plot is with the shadow capacitance, the lower plot is without it. Similarly, FIG. 5C depicts a plot of IM3 versus frequency for an Fs of 6 GHz, with (upper plot) and without (lower plot) shadow capacitances according to an example.

FIG. 5D depicts a plot of IM3 versus output signal current in milliamperes (mA) at a fixed frequency, here Ncyc=300 with a sampling frequency of 12 GHz, with and without shadow capacitances, according to an example. As shown, the lower plot 596 is without the addition of shadow capacitors, and the upper plot 595 is with the addition of shadow capacitors. As also shown in FIG. 5D, there is a minimum current, below which the addition of shadow capacitors actually increases the IM3 distortion. In this example the shadow capacitors were turned off (as described above with reference to FIGS. 3 and 4) for all output currents below 16 mA. As noted in FIG. 5D, there is only one bit control in this example, as there is only one shadow capacitor per side of the DAC current cell. However, in one or more alternate examples, multiple sets of shadow capacitors may be provided for each side of the DAC cell, and the circuit may enable one, two or multiple shadow capacitors as a function of frequency or other parameters. Such an alternate example is described below with reference to FIGS. 6A and 6B.

Figure 6A:
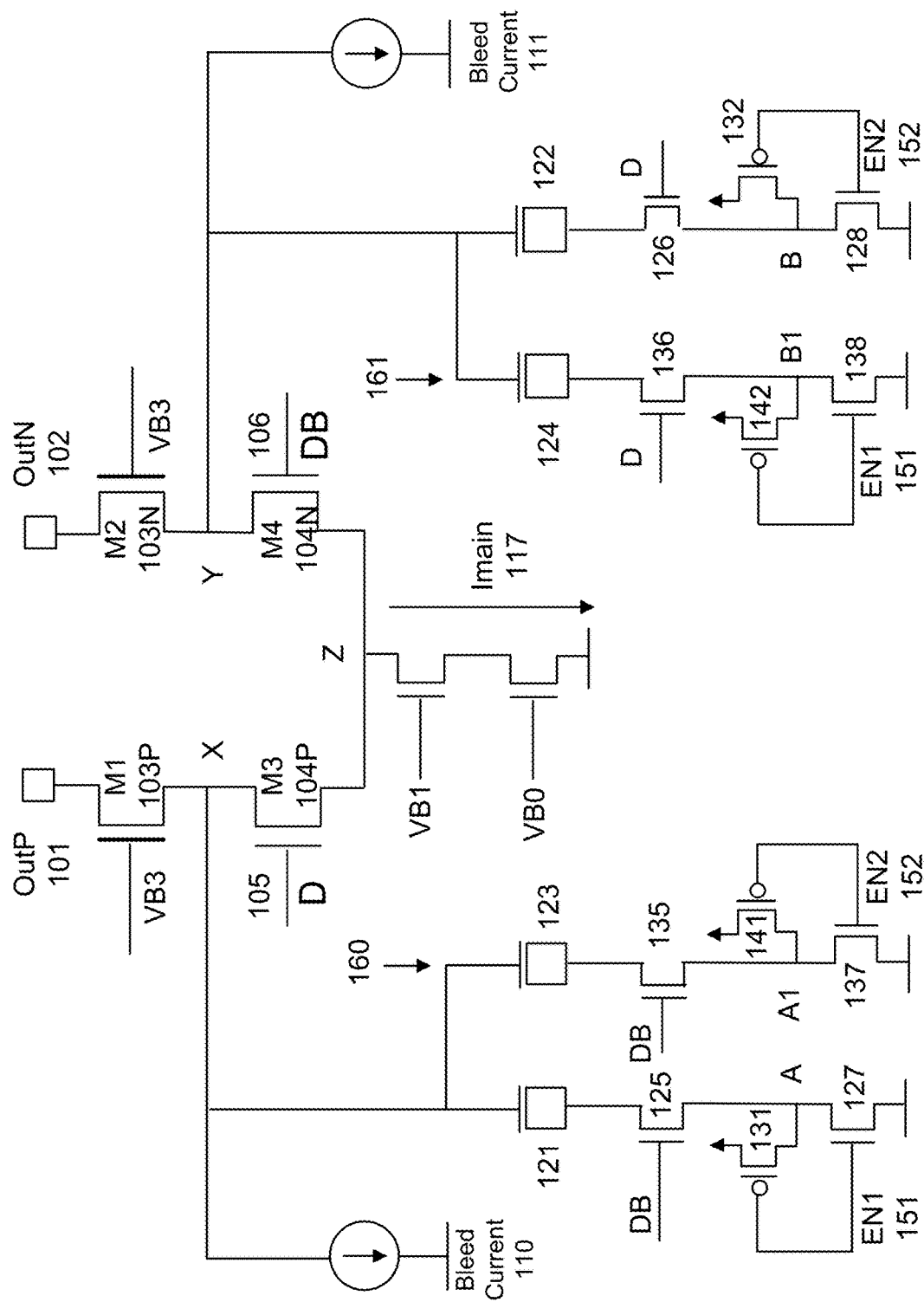
FIG. 6A is an alternate implementation of the DAC current cell of FIG. 4, according to an example.

FIG. 6A depicts an enhanced version 600 of the DAC current cell of FIG. 4, where two shadow capacitances are provided in parallel on each side of example DAC current cell 600. With reference to FIG. 6A, additional shadow capacitance branches 160 and 161 are provided. Branch 160, on the left side of the cell, includes shadow capacitor 123, switching transistor 135, footer switch 137 and pull-up transistor 141, which pulls up node A1 to Vdd when a second enabling signal, EN2 152, is asserted. Similarly, on the right side of the cell, additional branch 161 includes shadow capacitor 124, switching transistor 136, footer switch 138 and pull-up transistor 142, which pulls up node B1 to Vdd when EN2 152 is asserted. In one or more examples, the values of the two shadow capacitors in each of the two branches connecting nodes X or Y to ground, as the case may be, may be the same, or for example, they may be different. In alternate examples there may be three or more total parallel branches per side of the cell, each branch including its own shadow capacitor coupled between node X or Y, as the case may be, and ground, thereby allowing multiple values of shadow capacitance to be added or removed to each side of the cell, as may be needed, for robust flexibility.

Figure 6B:
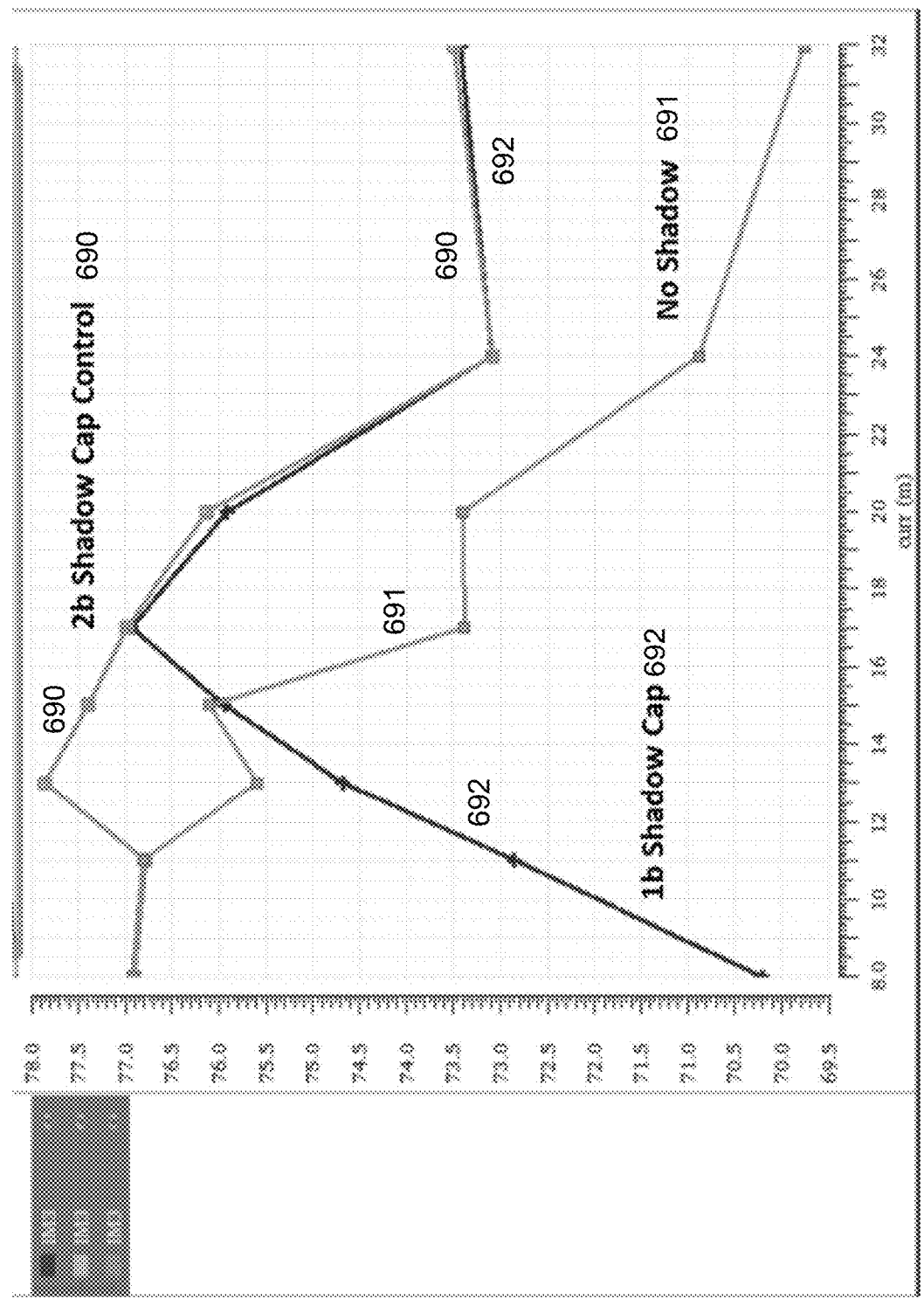
FIG. 6B depicts a plot of IM3 versus output signal current at a fixed frequency, with none, one and two sets of shadow capacitances according to an example.

FIG. 6B depicts a plot of a simulation done for two parallel shadow capacitors added to each side of a DAC current cell. FIG. 6B is analogous to FIG. 5D, in that what is shown is IM3 versus output signal current at a fixed frequency, for the cases of none, one and two sets of shadow capacitances added to the DAC current cell, according to an example. In the example of FIG. 6B, Fs is 12 GHz. With reference thereto, plot 691 illustrates the case of no added shadow capacitance. As may readily be seen, IM3 increases significantly with output current, which is determined by Imain 117, as shown, for example, in FIG. 6A. Plot 692 is for the case of only one shadow capacitor being added, and, as shown, for an output current less than 15 mA, it degrades performance, but for output current greater than 15 mA, it greatly enhances it. It is noted that, for plot 692, the performance is degraded for output current below 15 mA because the shadow capacitance added via capacitors 121, 123 and 122, 124, with reference to FIG. 6A, tries to balance the switching capacitive load. However, the capacitive switching load varies with $I_{main}$, e.g., with different output current settings. Thus, a given fixed value of shadow capacitance may only be used in an associated range of current settings. This is why, in a preferred approach, multiple parallel branches of shadow capacitors may be added to a DAC current steering cell to respectively couple each of nodes X and Y to ground, and one or more branches may be switched in and out as a function of output current.

While FIG. 6A illustrates the case of two branches of shadow capacitors, in one or more examples there may be three, or even more parallel branches coupling each of nodes X and Y to ground, and the various capacitance values added in each individual branch may be designed so that the overall range of output current that the DAC cell is designed for is fully covered by an appropriate shadow capacitance. Finally, plot 690 illustrates the case of an additional shadow capacitance, different than that used in plot 692, also being added. For output currents greater than 17 mA, plot 692 tracks almost identically the performance of plot 690, representing the one shadow capacitor case. However, for output currents less than 17 mA, but larger than 11 mA it significantly exceeds the performance of both of plots 692, the one shadow capacitor case, and 690, the no shadow capacitor case. For output currents below 11 mA, it tracks identically the performance of plot 691. Thus, in the example of FIG. 6B, to most efficiently run the DAC cell, both shadow capacitors may be switched on at 11 mA, and both kept on until the output current reaches 17 mA. At 17 mA or greater output currents, the second shadow capacitor may be disenabled, and the performance will follow plot 692, which, at the higher values of Imain, is essentially the same as the two-capacitor case of plot 690.

It is noted that while the example DAC cells illustrated in each of FIGS. 2-4 and 6A implement the DAC cell in NMOS transistors, other transistor types may be used to implement the circuit, as is known in the art. Thus, for example, if PMOS transistors are used, then each of the shadow capacitors will be controlled by PMOS transistors, which will couple nodes of the PMOS enabled differential amplifier that are analogous to nodes X and Y of FIGS. 2-4 and 6A, to Vdd. Moreover, in FIGS. 4 and 6A, for example, the analogues to transistors 131, 141, and 132, 142 would be NMOS transistors, which pull down the equivalents to nodes A, A1 and B, B1, respectively. Essentially a topology of a PMOS implementation of the circuits shown in FIGS. 2-4 and 6A would be a 180 degree rotated version of those circuits about an axis normal to, and protruding out of the page.

It is further noted that while the example DAC cells illustrated in each of FIGS. 2-4 and 6A implement the DAC cell with a two transistor stack on each side of the differential amplifier, e.g., 103P, 104P on the left side, and 103N, 104N on the right side, this is not absolutely necessary. The function of the upper tier of transistors 103P, 103N is to operate in a higher voltage realm, and thus the area of these transistors is larger, and this upper tier insulates the lower tier of transistors, 104P and 104N, from the output voltages and allows the lower tier of transistors 104P and 104N to be smaller, and thus to switch more quickly, which is desired for the transistors that actually steer the current to either OutP 110 or OutN 102. However, in some applications a somewhat larger area of switching transistors may be implemented, with a somewhat slower switching speed, and thus the upper tier of transistors may be, in those alternate embodiments, eliminated. Thus, in alternate embodiments, with reference to FIG. 6C, which is a modified version of FIG. 6A, a single tier differential amplifier may be used, as next described. It is understood that the very same modifications may be made to any of FIGS. 2-4, they are presented with reference to FIGS. 6A and 6C for ease of illustration.

Figure 6C:
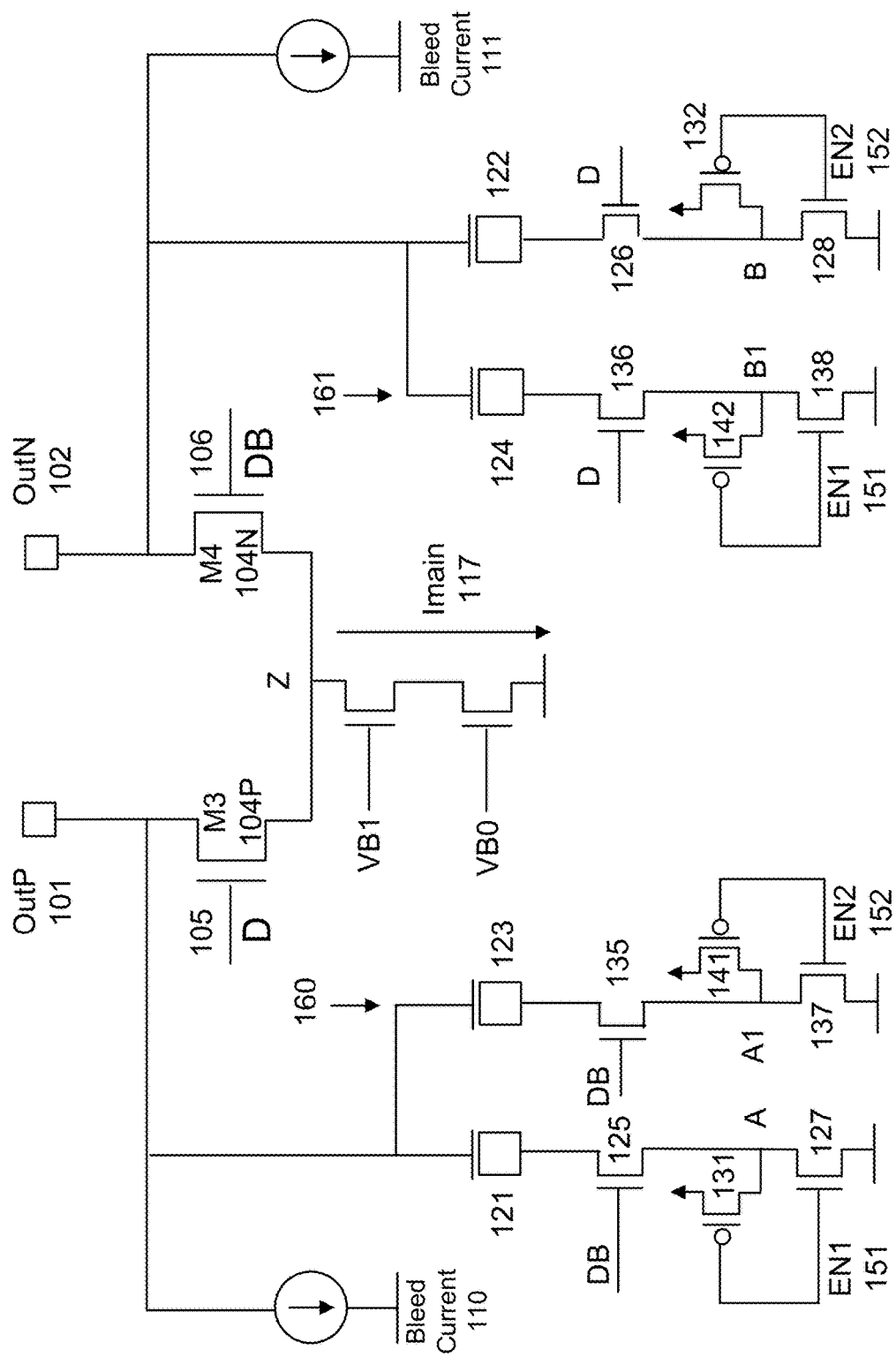
FIG. 6C is an alternate implementation of the DAC current cell of FIG. 6A, according to an example.

With reference to FIG. 6C, there is depicted a modified version 601 of the DAC current cell of FIG. 6A. In the DAC current cell of FIG. 6C, the one or more branches of shadow capacitors for example, 121 and 123 on the left side, and 122 and 124 on the right side of the example DAC current cell, here are coupled between a respective output node 101, 102, and ground. This is because the differential amplifier only includes one set of transistors, not a cascoded stack as, for example, shown in FIG. 6A. Thus, there is no internal nodes X and Y provided where a source of an upper transistor of a side of the amplifier is coupled to a drain of a lower, or switching transistor of that side. Here, in the example of FIG. 6C, the drains of the two switching transistors 104P and 104N are themselves coupled directly to their respective output nodes 101, and 102, as shown. In all other respects, DAC current cell 601 is equivalent to DAC current cell 600 of FIG. 6A. Thus, in one or more examples, the values of the two shadow capacitors in each of the two branches connecting nodes 101 or 102 to ground, as the case may be, may be the same, or for example, they may be different. In alternate examples there may be three or more total parallel branches per side of the cell, each branch including its own shadow capacitor coupled between node 101 or 102 as the case may be, and ground, thereby allowing multiple values of shadow capacitance to be added or removed to each side of the cell, as may be needed, for robust flexibility.

FIG. 7 is a flow diagram of a method 700 for providing a DAC current cell, according to an example. Method 700 includes blocks 710 through 750. In alternate examples method 700 may include greater, or fewer, blocks. Method 700 begins at block 710 where a first transistor and a second transistor are provided, a drain of the first transistor coupled to a first output, a source of the first transistor coupled to a drain of the second transistor at a first node, and a gate of the second transistor coupled to a data input. For example, these may be the left side of the differential amplifier illustrated in FIGS. 2-4, and the first node may be node X.

From block 710, method 700 proceeds to block 720, where a third transistor and a fourth transistor are provided, a drain of the third transistor coupled to a second output, a source of the third transistor coupled to a drain of the fourth transistor at a second node, and a gate of the fourth transistor coupled to a complement of the data input. For example, these may be the right side of the differential amplifier illustrated in FIGS. 2-4, and the second node may be node Y.

From block 720, method 700 proceeds to block 730, where a source of the second transistor and a source of the fourth transistor are connected, and coupled to ground. For example, these may be transistors M3 104P and M4 104N of FIGS. 2-4, coupled at common source node Z, which, in turn, is coupled to ground.

From block 730, method 700 proceeds to block 740, where a first bleed current source is coupled between the first node and ground, and a second bleed current source coupled between the second node and ground. For example, the bleed current sources may be bleed current sources 110 and 111 of FIGS. 2-4. As noted above, in some examples the bleed current elements need not be provided.

From block 740, method 700 proceeds to block 750, where there are provided first and second shadow capacitors, respectively coupled, via first and second switches, between the first and second nodes and ground, the first switch controlled by the complement of the data input, and the second switch controlled by the data input. For example, the first and second shadow capacitors may be MOS capacitors 121 and 122 of FIG. 3, respectively. Method 700 terminates at block 750.

Figure 8:
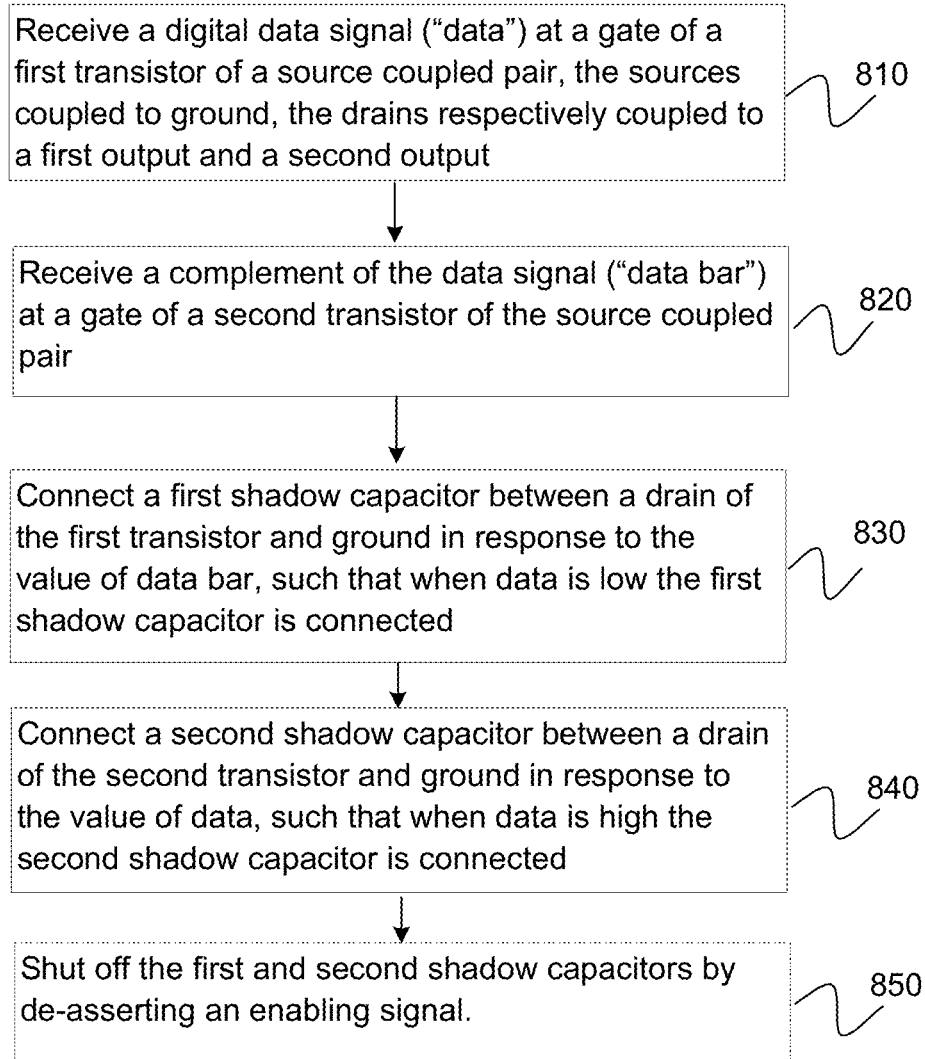
FIG. 8 is a flow diagram of a method of operating a DAC current cell, according to an example.

FIG. 8 is a flow diagram of a method 800 of operating a DAC current cell, according to an example. Method 800 includes blocks 810 through 840, and optional block 850. In alternate examples method 800 may include greater, or fewer, blocks. Method 800 begins at block 810 where a digital data signal ("data") is received at a gate of a first transistor of a source coupled pair, the sources coupled to ground, the drains respectively coupled to a first output and a second output. For example, the DAC current cell may be cell 400 of FIG. 4, the first transistor M3 104P, and the data signal D 105.

From block 810, method 800 proceeds to block 820, where a complement of the data signal ("data bar") is received at a gate of a second transistor of the source coupled pair. For example, the DAC current cell may be cell 400 of FIG. 4, the second transistor M4 104N, and the data bar signal DB 105.

From block 820, method 800 proceeds to block 830, where a first shadow capacitor is connected between a drain of the first transistor and ground in response to the value of data bar, such that when data is low the first shadow capacitor is connected. For example, with reference to FIG.

4, the first shadow capacitor may be MOS capacitor 121, which is switched on when DB 106 is high.

From block 830, method 800 proceeds to block 840, where a second shadow capacitor is connected between a drain of the second transistor and ground in response to the value of data, such that when data is high the second shadow capacitor is connected. For example, with reference to FIG. 4, the second shadow capacitor may be MOS capacitor 122, which is switched on when D 105 is high.

Method 800 may terminate at block 840. However, optionally, method 800 may proceed to optional block 850, where off the first and second shadow capacitors are shut-off by de-asserting an enabling signal. For example, again with reference to FIG. 4, the first and second shadow capacitors 121 and 122 may be switched off by de-asserting the "Shadow EN" signal that is applied to the gates of transistors 127, 128, 131 and 132. Method 800 then terminates at optional block 850.

While the foregoing is directed to embodiments of the present invention, other and further embodiments of the invention may be devised without departing from the basic scope thereof, and the scope thereof is determined by the claims that follow.

What is claimed is:

1. A digital to analog converter (DAC) current steering circuit, comprising:
    a first transistor, a drain of the first transistor coupled to a first output, a source of the first transistor coupled to a drain of a second transistor at a first node, and a gate of the second transistor coupled to a data input;
    third and fourth transistors, a drain of the third transistor coupled to a second output, a source of the third transistor coupled to a drain of the fourth transistor at a second node, and a gate of the fourth transistor coupled to a complement of the data input; and
    first and second shadow capacitors respectively coupled, via first and second switches, between the first and second nodes and ground, the first switch controlled by the complement of the data input, and the second switch controlled by the data input.

2. The circuit of claim 1, wherein the first and second shadow capacitors are one of: metal-oxide-semiconductor (MOS) capacitors, metal on insulator (MiN) capacitors, or metal on metal (MoM) capacitors.

3. The circuit of claim 1, further comprising a first bleed current source coupled between the first node and ground, and a second bleed current source coupled between the second node and ground.

4. The circuit of claim 3, wherein the first and second shadow capacitors are metal-oxide-semiconductor (MOS) capacitors.

5. The circuit of claim 1, wherein, the sources of the second and fourth transistors are connected at a third node, the third node coupled to ground via a main current source.

6. The circuit of claim 5, wherein the main current source includes a stack of one or more transistors, each of whose gates are supplied with a pre-defined voltage signal.

7. The circuit of claim 1, wherein:
    the first switch includes a fifth transistor whose drain is coupled to the first shadow capacitor, whose source is coupled to ground, and whose gate is coupled to the complement of the data input; and
    the second switch includes a sixth transistor whose drain is coupled to the second shadow capacitor, whose source is coupled to ground, and whose gate is coupled to the data input.

8. The circuit of claim 7, wherein:
    each of the first and second switches further includes a footer switch, the footer switches configured to respectively couple the first and second shadow capacitors to ground when an enabling signal is asserted.

9. The circuit of claim 8, wherein the enabling signal is a first enabling signal, and further comprising:
    a third shadow capacitor, coupled via a third switch between the first node and ground, the third switch also controlled by the complement of the data input, the third switch including a footer switch configured to couple the third shadow capacitor to ground when a second enabling signal is asserted; and
    a fourth shadow capacitor, coupled via a fourth switch between the second node and ground, the fourth switch also controlled by the data input, the fourth switch including a footer switch configured to couple the fourth shadow capacitor to ground when the second enabling signal is asserted.

10. A digital to analog converter (DAC) current steering circuit, comprising:
    a first transistor, a drain of the first transistor coupled to a first output node, a source of the first transistor coupled to a common node, and a gate of the first transistor coupled to a data input;
    a second transistor, a drain of the second transistor coupled to a second output node, a source of the second transistor coupled to the common node, and a gate of the second transistor coupled to a complement of the data input; and
    first and second shadow capacitors respectively coupled, via first and second switches, between the first and second output nodes and ground, the first switch controlled by the complement of the data input, and the second switch controlled by the data input.

11. The circuit of claim 10, wherein each of the first and second shadow capacitors are one of: metal-oxide-semiconductor (MOS) capacitors, metal on insulator (MiN) capacitors, or metal on metal (MoM) capacitors.

12. The circuit of claim 10, further comprising a first bleed current source coupled between the first output node and ground, and a second bleed current source coupled between the second output node and ground.

13. The circuit of claim 10, wherein:
    the first switch includes a third transistor whose drain is coupled to the first shadow capacitor, whose source is coupled to ground, and whose gate is coupled to the complement of the data input; and
    the second switch includes a fourth transistor whose drain is coupled to the second shadow capacitor, whose source is coupled to ground, and whose gate is coupled to the data input.

14. The circuit of claim 13, wherein:
    each of the first and second switches further includes a footer switch, the footer switches configured to respectively couple the first and second shadow capacitors to ground when an enabling signal is asserted.

15. The circuit of claim 14, wherein the enabling signal is a first enabling signal, and further comprising:
    one or more first additional shadow capacitors, each coupled via a first additional switch between the first output node and ground, each first additional switch controlled by the complement of the data input, and each first additional switch respectively including a footer switch configured to couple its corresponding first additional shadow capacitor to ground when a respective enabling signal is asserted; and one or more second additional shadow capacitors, each coupled via a second additional switch between the second output node and ground, each second additional switch controlled by the data input, and each second additional switch respectively including a footer switch configured to couple its corresponding second additional shadow capacitor to ground when a respective enabling signal is asserted.

16. A method of operating a DAC cell, comprising:

receiving a digital data signal ("data") at a gate of a first transistor of a source coupled pair, the sources coupled to ground, and the drains respectively coupled to a first output and a second output;

receiving a complement of the data signal ("data bar") at a gate of a second transistor of the source coupled pair;

connecting a first shadow capacitor between a drain of the first transistor and ground in response to a value of data bar, such that when data is low the first shadow capacitor is connected; and connecting a second shadow capacitor between a drain of the second transistor and ground in response to a value of data, such that when data is high the second shadow capacitor is connected.

17. The method of claim 16, further comprising:

connecting a third shadow capacitor between the drain of the first transistor and ground in response to each of: the value of data bar and the value of a first enabling signal, such that when data is low and the enabling signal is high the third shadow capacitor is connected; and connecting a fourth shadow capacitor between the drain of the second transistor and ground in response to each of: the value of data and the value of a second enabling signal, such that when data is high and the enabling signal is high the fourth shadow capacitor is connected.

18. The method of claim 17, wherein each of the first, second, third and fourth shadow capacitors are one of: metal-oxide-semiconductor (MOS) capacitors, metal on insulator (MiN) capacitors, or metal on metal (MoM) capacitors.

19. The method of claim 18, further comprising causing the first and second enabling signals to go high when a current of the source coupled pair is less than or equal to a pre-defined threshold.

20. The method of claim 17, further comprising disconnecting the first and second shadow capacitors once the third and fourth shadow capacitors are connected.

* * * * *